US011392453B2

(12) United States Patent
Briat et al.

(10) Patent No.: US 11,392,453 B2
(45) Date of Patent: Jul. 19, 2022

(54) ERROR CORRECTION CODE MEMORY

(71) Applicants: STMicroelectronics (Grenoble 2) SAS, Grenoble (FR); STMicroelectronics (Alps) SAS, Grenoble (FR); STMicroelectronics (Rousset) SAS, Rousset (FR)

(72) Inventors: Gerald Briat, Grenoble (FR); Antoine De-Muynck, La Buisse (FR); Alessandro Bastoni, Aix en Provence (FR); Stephane Marmey, Fontanil (FR)

(73) Assignees: STMicroelectronics (Grenoble 2) SAS, Grenoble (FR); STMicroelectronics (Alps) SAS, Grenoble (FR); STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 16/562,025

(22) Filed: Sep. 5, 2019

(65) Prior Publication Data
US 2020/0081776 A1   Mar. 12, 2020

(30) Foreign Application Priority Data
Sep. 6, 2018   (FR) ...................................... 1857993

(51) Int. Cl.
*G11C 29/00* (2006.01)
*G06F 11/10* (2006.01)
*G11C 17/00* (2006.01)

(52) U.S. Cl.
CPC .......... *G06F 11/1068* (2013.01); *G11C 17/00* (2013.01)

(58) Field of Classification Search
CPC .................................................. G06F 11/1068
See application file for complete search history.

(56) References Cited

U.S. PATENT DOCUMENTS

| 8,181,100 | B1 * | 5/2012 | Purdham | G11C 29/42 714/819 |
| 2004/0225943 | A1 * | 11/2004 | Brueggen | H03M 13/01 714/758 |
| 2012/0239993 | A1 * | 9/2012 | Chung | G01R 31/318547 714/727 |
| 2012/0266033 | A1 * | 10/2012 | Gold | G06F 11/2215 714/718 |
| 2013/0151930 | A1 * | 6/2013 | Yigzaw | G06F 11/2236 714/768 |
| 2015/0012780 | A1 * | 1/2015 | Kalayci | G06F 11/263 714/32 |
| 2017/0286197 | A1 | 10/2017 | Halbert et al. | |
| 2018/0174664 | A1 | 6/2018 | Byeon | |
| 2018/0247699 | A1 * | 8/2018 | Pope | G11C 29/10 |
| 2018/0331692 | A1 * | 11/2018 | Gulati | G06F 11/2215 |

OTHER PUBLICATIONS

INPI Search Report and Written Opinion for FR 1857993 dated May 21, 2019 (9 pages).

* cited by examiner

*Primary Examiner* — Samir W Rizk
(74) *Attorney, Agent, or Firm* — Crowe & Dunlevy

(57) ABSTRACT

An error-correction code memory includes memory locations for storing data. The memory is programmed to store one or more intentionally invalid words. Testing of an error correction circuit for the memory is performed by accessing the one or more intentionally invalid words and performing an error detection and error correction operation.

31 Claims, 1 Drawing Sheet

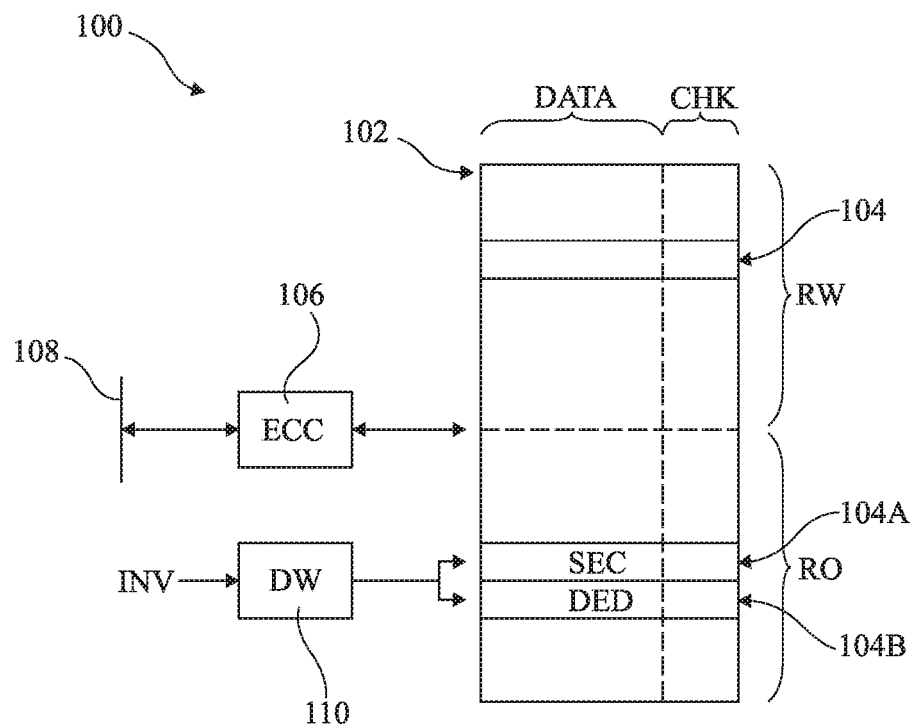

ERROR CORRECTION CODE MEMORY

PRIORITY CLAIM

This application claims the priority benefit of French Application for Patent No. 1857993, filed on Sep. 6, 2018, the content of which is hereby incorporated by reference in its entirety to the maximum extent allowable by law.

TECHNICAL FIELD

The present disclosure generally concerns electronic devices, and more particularly error-correction code memories.

BACKGROUND

In an error-correction code memory, the error correction code enables to detect and/or correct one or a plurality of errors in the stored data. Such a memory is generally comprised within an integrated circuit chip.

SUMMARY

An embodiment overcomes all or part of the disadvantages of known error-correction code memories.

An embodiment provides a method comprising writing one or a plurality of intentionally invalid words into an error-correction code memory.

According to an embodiment, the method comprises, before said writing, a step of generation of the invalid word(s).

According to an embodiment, the method comprises, before said writing, a step of selection of consecutive locations in the memory for said words.

According to an embodiment, said word or one of said words comprises a single invalid bit.

According to an embodiment, said word or one of said words comprises exactly two invalid bits.

According to an embodiment, the method comprises, after said writing, a locking in read-only mode of said word(s).

An embodiment provides an error-correction code memory, comprising one or a plurality of intentionally invalid words.

According to an embodiment, said words are located in consecutive locations.

According to an embodiment, said word(s) are accessible in read-only mode.

According to an embodiment, said word or one of said words comprises a single invalid bit.

According to an embodiment, said word or one of said words comprises exactly two invalid bits.

An embodiment provides a use of a memory such as defined here above to test an error-correction circuit.

An embodiment provides an electronic circuit configured to write one or a plurality of intentionally invalid words into an error-correction code memory.

According to an embodiment, the circuit is configured so that the writing of the intentionally invalid word(s) is performed in the factory.

According to an embodiment, the circuit comprises a memory such as defined here above.

BRIEF DESCRIPTION OF THE DRAWINGS

The foregoing and other features and advantages will be discussed in detail in the following non-limiting description of specific embodiments in connection with the accompanying drawings, wherein:

FIG. 1 shows an embodiment of a circuit comprising an error-correction code memory.

DETAILED DESCRIPTION

The same elements have been designated with the same reference numerals in the different drawings. In particular, the structural and/or functional elements common to the different embodiments may be designated with the same reference numerals and may have identical structural, dimensional, and material properties.

For clarity, only those steps and elements which are useful to the understanding of the described embodiments have been shown and are detailed. In particular, the error correction codes are not described in detail, the described embodiments being compatible with current error-correction codes.

Throughout the present disclosure, the term "connected" is used to designate a direct electrical connection between circuit elements with no intermediate elements other than conductors, whereas the term "coupled" is used to designate an electrical connection between circuit elements that may be direct, or may be via one or more intermediate elements.

In the following description, when reference is made to terms qualifying absolute positions, such as terms "front", "back", "top", "bottom", "left", "right", etc., or relative positions, such as terms "above", "under", "upper", "lower", etc., or to terms qualifying directions, such as terms "horizontal", "vertical", etc., unless otherwise specified, it is referred to the orientation of the drawings.

The terms "about", "substantially", and "approximately" are used herein to designate a tolerance of plus or minus 10%, preferably of plus or minus 5%, of the value in question.

FIG. 1 shows an embodiment of an electronic circuit 100, for example, an integrated circuit, comprising an error-correction code memory 102.

Memory 102 comprises memory locations 104. Locations 104 preferably all have the same number M of bits. Preferably, locations 104 follow one another in the memory. Memory 102 is preferably coupled to an error-correction circuit (ECC) 106. Circuit 106 couples memory 102, for example, to a data transmission bus 108.

In operation, circuit 106 receives a piece of data to be written into memory 102. The piece of data, for example, originates from bus 108. The piece of data has a number N of bits, for example, equal to 32 or 64 bits, preferably equal to 128 bits. Circuit 106 codes this piece of data by applying an error-correction code, that is, a technique of coding of the piece of data based on an information redundancy. The result of the coding is a word having a number of bits M greater than that of the non-coded piece of data.

Preferably, the coding comprises associating a signature (CHK) with the piece of data (DATA). The signature comprises a number K of bits per piece of data. Preferably, number K of bits of the signature is equal to 9 in the case of a 128-bit piece of data. The word resulting from the coding then comprises the set of the data and of the signature. Number M of bits of the word is equal to sum N+K, preferably equal to 137, of the number of bits of the data and of the signature. As an example, the bits of the signature are the least significant bits of the word. As a variation, in the word resulting from the coding, the bits of the signature are interposed, consecutively or not, between bits of the data.

The word resulting from the coding is written into one of locations 104. To achieve this, location 104 has the same number of bits M as this word. One or a plurality of errors may occur during the writing, or after the writing. An error corresponds to a difference of one bit between the content in the considered location and the word resulting from the coding of the data.

To read the data, the word located in the corresponding location 104 is read. Circuit 106 finds the data by using the error-correction code. As an example, to achieve this, circuit 106 verifies the signature and extracts the data from the read word. The piece of data thus obtained is, for example, sent over bus 108. When the read word exhibits one or a plurality of errors, the use of the error-correction code corrects or detects the error(s). Preferably, the error-correction code enables to correct a single error in a word (SEC, "Single Error Correction") and to detect two errors in the same word (DED, "Double Error Detection"). Any error correction code, for example, enabling to detect one error only, or to correct and/or to detect more than respectively one and two errors, may be used. This conditions, among others, the size of the result of the data coding.

Due to the redundancy of information having the error correction code based thereon, only certain words are valid, that is, can result from the application of the code. For example, the signature is univocally associated with the coded piece of data. Thereby, although the data may take any value, the result of the coding of the data cannot be any word. In this example, the valid words are those, and only those, where the signature corresponds to the data.

The set of valid words corresponds to all the results of the coding of all the pieces of data, that is, of the 2^N pieces of data respectively corresponding to all combinations of N bits ("^" representing the power function). For each of the 2^N combinations, the result of the coding of the data is a different valid word. There thus are 2^N valid words among the 2^M words respectively corresponding to all the combinations of M bits.

In the embodiment of FIG. 1, the content of one of the locations 104 of memory 102 is an intentionally invalid word.

A word is here called invalid when it does not belong to the set of valid words, that is, when the word differs from the result of the application of the error-correction code to any piece of data. An invalid word contains at least one invalid bit, that is, this word differs from any of the valid words by at least one bit. For example, an invalid word comprises a piece of data and a signature which do not match. According to another example, an invalid word comprises a single invalid bit, that is, this word has a difference of a single bit with at least one of the valid words. According to still another example, an invalid word comprises exactly two invalid bits, that is, the word differs from at least one of the valid words by exactly two bits.

A word is called intentionally invalid when it results from a step of generation of an invalid word followed by the writing of the invalid word into one of locations 104. Any generation step providing an invalid word at each implementation of this step can be used. Preferably, this generation step prior to the writing comprises a calculation step, for example, the coding of a piece of data and the invalidation of at least one bit in the word resulting from the coding. The invalidation of a bit in the word, for example, corresponds to the modification of one of the bits of the word. Preferably, a plurality of the words located in locations 104 are intentionally invalid. Preferably, the word located in one at least of the locations (104A) comprises a single invalid bit. Preferably, the word located in one at least of the locations (104B) comprises exactly two invalid bits.

The provision of intentionally invalid words stored in memory 102 enables the testing of the circuit 106, in particular the error correction and/or detection by circuit 106.

To correct one or a plurality of errors in an erroneous word read from the memory, circuit 106 preferably determines a valid word considered as corrected. Preferably, this corrected valid word is the valid word closest to the erroneous word, that is, that, among the valid words, which has the smallest number of bits different from those of the erroneous word. Circuit 106 finds the piece of data from the corrected valid word. The found piece of data is thus, preferably, that for which the result of the coding is the closest to the erroneous word.

To test the operation of the error correction by circuit 106, it is verified that circuit 106 supplies a piece of data from an invalid word, and that the piece of data is that which is expected for a proper operation. The invalid word corresponds to a result of coding of the expected piece of data made erroneous by one or a plurality of errors. Thus, the expected piece of data is thus, preferably, that for which the result of the coding is the closest to the invalid word. This expected piece of data is preferably unique. The invalid word used for the test preferably comprises a single erroneous bit (location 104A).

Thus, when the circuit delivers the expected piece of data, it can be deduced that the circuit has considered the invalid word as an erroneous word and has effectively corrected the error(s). The number of errors is preferably equal to the number of invalid bits. Preferably, the expected piece of data is the data used to generate the invalid word. For a single invalid bit, the expected piece of data is preferably the single piece of data for which the invalid word corresponds to the coding result modified by a single error. It is thus verified that circuit 106 corrects this single error (SEC).

Taking a specific example where the data have four bits and the signature for example has four parity bits, each parity bit corresponds to the sum of the three bits located in the piece of data at the three positions other than that of the parity bit in the signature. This coding enables to correct an error and to detect two errors. The coding of data '1011' results in valid word '10110100' comprising the piece of data and signature '0100'. Assuming that location 104A contains the invalid word '10110110' obtained by intentional modification of the second bit of the valid word, starting from the least significant bits, the valid word closest to this invalid word is '10110100', and the expected piece of data is '1011'. Thus, when circuit 106 delivers the expected data '1011' from the invalid word located in location 104A, this means that the error correction has occurred properly.

To test the operation of the error detection by circuit 106, it is verified that circuit 106 considers an invalid word as an erroneous word. The circuit is expected to then detect the presence of one or of plurality of errors. The invalid word used for the test preferably comprises exactly two invalid bits (location 104B). Thus, the invalid word corresponds to a coding result modified by two errors. It is thus verified that circuit 106 detects the presence of these two errors (DED).

Taking the above numerical example, it is assumed that location 104B contains the invalid word '10100110' obtained by intentional modification of the second and fifth bits of the valid word '10110100', starting from the least significant bits. Apart from valid word '10110100', other valid words also have a two-bit difference with the invalid word and are also closest to the invalid word. This is, for example, true for the valid word '10101010' resulting from the coding of data '1010'. When circuit 106 detects an error in the invalid word located in location 104B, preferably without correcting it, this means that the error correction has occurred properly.

Other locations 104A and/or 104B containing words respectively having a single and exactly two invalid bits are preferably provided. Circuit 106 can thus be tested, for example, for various pieces of data and various positions at which the errors may occur. Preferably, a plurality, for example, more than two, locations containing words having a single invalid bit, are provided. Preferably, a plurality of, for example, more than two, locations containing words having two invalid bits are provided. The number of invalid bits in each word may be adapted according to the error correction code used. The number of invalid word locations may be adapted according to the number of bits of the data.

As an example, circuit 106 emits an error signal, such as a flag or an interrupt, when it corrects and/or detects an error. The presence of this error signal is preferably verified during the testing of circuit 106. Further, a user may include circuit 100 in a device comprising a data processing circuit such as a microprocessor (not shown). The user may provide for the processing circuit to execute a specific program in the case where an error is detected and/or corrected by circuit 106. Such a program is, for example, executed by the microprocessor after the reception of the error signal originating from circuit 106. The provision of locations containing intentionally invalid words then enables the user to test the operation of this program.

As an example, the location(s) intended to be filled with the intentionally invalid words are coupled to an electronic circuit 110 (DW). Circuit 110 receives an invalid word INV. Circuit 110 directly loads the invalid word into the memory, that is, without coding such as that performed by circuit 106. As a variation, an intentionally invalid word is stored in circuit 110. In another variation, circuit 110 is designed to generate invalid words. In this variation, preferably, circuit 110 receives a signal for controlling the writing of an invalid word into the memory. Preferably, circuit 110 generates an invalid word each time it receives the signal.

As an example, circuit 110 is located in a device external to circuit 100. As an example, the device is used to write invalid words into the memories 102 of a plurality of circuits 100, preferably in the factory. The invalid words are then, for example, identical in a plurality of memories 102 of circuits 100. As a variation, circuit 110 is comprised within circuit 100, and a user may use this circuit to write invalid words into the memory.

Preferably, circuit 110 is used to write various data comprising, for example, a program, into a portion RO of memory 102. Preferably, the invalid word(s) are located among these data. As an example, the program is a bootloader. After the writing, preferably, portion RO is locked in read-only mode, that is, it is forbidden to write again into portion RO of the memory. The intentionally invalid words are then only readable, for example, via circuit 106. Preferably, another portion RW of memory 102 remains accessible in read and write mode via circuit 106.

Preferably, the locations selected to be filled with the intentionally invalid words are consecutive. This enables the user to easily use the invalid words. Preferably, the location(s) 104 having intentionally invalid words are located in portion RO of the memory.

Various embodiments and variations have been described. It will be understood by those skilled in the art that certain features of these various embodiments and variations may be combined, and other variations will occur to those skilled in the art.

Finally, the practical implementation of the described embodiments and variations is within the abilities of those skilled in the art based on the functional indications given here above.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A method, comprising:
   writing at least one intentionally invalid word into a first portion of an error-correction code memory; and
   locking the first portion of the error-correction code memory in a read-only mode of access such that it is forbidden to write again to said first portion.

2. The method of claim 1, further comprising, before said writing, generating said at least one intentionally invalid word.

3. The method of claim 1, wherein writing at least one intentionally invalid word comprises writing a plurality of intentionally invalid words into the first portion, and further comprising, before said writing, selecting consecutive locations in the first portion of the error-correction code memory storing said plurality of intentionally invalid words.

4. The method of claim 1, wherein said at least one intentionally invalid word comprises a single invalid bit.

5. The method of claim 1, wherein said at least one intentionally invalid word comprises exactly two invalid bits.

6. The method of claim 1, further comprising:
   reading the at least one intentionally invalid word from the first portion of the error-correction code memory; and
   processing the at least one intentionally invalid word to detect and correct error in order to confirm proper operation an error detection and correction function.

7. The method of claim 1, further comprising testing operation of an error detection and correction by reading the at least one intentionally invalid word from the first portion of the error-correction code memory and processing the least one intentionally invalid word to detect and correct error due to the intentional invalidity of the word.

8. The method of claim 1, wherein writing the at least one intentionally invalid word comprises writing the at least one intentionally invalid word into the first portion of the error-correction code memory in a factory at manufacture of the memory.

9. An apparatus, comprising:
   an error-correction code memory, comprising:
   a first memory portion including at least one memory location;
   wherein the at least one memory location stores an intentionally invalid word; and
   wherein the first memory portion is locked in a read-only mode of access such that it is forbidden to write to said first memory portion after storing of the intentionally invalid word.

10. The apparatus of claim 9, wherein said at least one memory location comprises a plurality of memory locations, each memory location storing an intentionally invalid word.

11. The apparatus of claim 10, wherein the plurality of memory locations are consecutive memory locations in the first memory portion.

12. The apparatus of claim 9, wherein said intentionally invalid word comprises a single invalid bit.

13. The apparatus of claim 9, wherein said intentionally invalid word comprises exactly two invalid bits.

14. The apparatus of claim 9, wherein said intentionally invalid word is used to test an error correction circuit.

15. The apparatus of claim 9, further comprising an error correction circuit configured to retrieve the intentionally invalid word from the first memory portion and process the intentionally invalid word to detect and correct error due to the intentional invalidity of the word in order to test functionality of the error correction circuit.

16. The apparatus of claim 9, further comprising a circuit configured to write words into a second portion of the error-correction code memory.

17. The apparatus of claim 9, further comprising an error correction circuit configured to retrieve words from the second memory portion and process the words to detect and correct error.

18. The apparatus of claim 9, wherein the intentionally invalid word is written in the first memory portion in a factory at manufacture of the error-correction code memory.

19. An error-correction code memory, comprising:
   a first memory portion including at least one memory location;
   wherein the at least one memory location stores an intentionally invalid word; and
   wherein the first memory portion is locked in a read-only mode of access such that it is forbidden to write to said first memory portion after storing of said intentionally invalid word.

20. The error-correction code memory of claim 19, wherein said at least one memory location comprises a plurality of memory locations, each memory location storing an intentionally invalid word.

21. The error-correction code memory of claim 20, wherein the plurality of memory locations are consecutive memory locations in the first memory portion.

22. The error-correction code memory of claim 19, wherein said intentionally invalid word comprises a single invalid bit.

23. The error-correction code memory of claim 19, wherein said intentionally invalid word comprises exactly two invalid bits.

24. The error-correction code memory of claim 19, wherein said intentionally invalid word is used to test an error correction circuit.

25. The error-correction code memory of claim 19, wherein the intentionally invalid word is written in the first memory portion in a factory at manufacture of the error-correction code memory.

26. A method, comprising:
   writing data into a first portion of an error-correction code memory, said data comprising a bootloader program and at least one intentionally invalid word; and
   then locking the first portion of the error-correction code memory in a read-only mode of access which forbids further writing of data into said first portion.

27. The method of claim 26, further comprising:
   reading the at least one intentionally invalid word from the first portion of the error-correction code memory; and
   processing the at least one intentionally invalid word to detect and correct error in order to confirm proper operation an error detection and correction function.

28. The method of claim 26, wherein writing data comprises writing the bootloader program and the at least one intentionally invalid word into the first portion of the error-correction code memory in a factory at manufacture of the memory.

29. A circuit, comprising:
   an error-correction code memory, comprising:
      a first memory portion including memory locations storing data, wherein said data comprises a bootloader program and at least one intentionally invalid word; and
      a second memory portion; and
   wherein the first memory portion is locked in a read-only mode of access which forbids writing of data into said first memory portion.

30. The circuit of claim 29, further comprising an error correction circuit configured to retrieve the intentionally invalid word from the first memory portion and process the intentionally invalid word to detect and correct error due to the intentional invalidity of the word in order to test functionality of the error correction circuit.

31. The circuit of claim 29, wherein the bootloader program and the intentionally invalid word are written in the first memory portion in a factory at manufacture of the error-correction code memory.

\* \* \* \* \*